United States Patent
Xiao (10) Patent No.: US 8,526,312 B2
(45) Date of Patent: Sep. 3, 2013

(54) INFORMATION DETECTION METHOD AND APPARATUS FOR HIGH SPEED DOWNLINK SHARED CONTROL CHANNEL

(75) Inventor: Haiyong Xiao, Shenzhen (CN)

(73) Assignee: ZTE Corporation, Shenzhen (CN)

( * ) Notice: Subject to any disclaimer, the term of this patent is extended or adjusted under 35 U.S.C. 154(b) by 118 days.

(21) Appl. No.: 13/258,393

(22) PCT Filed: Apr. 13, 2010

(86) PCT No.: PCT/CN2010/071737
§ 371 (c)(1),
(2), (4) Date: Dec. 26, 2011

(87) PCT Pub. No.: WO2010/148716
PCT Pub. Date: Dec. 29, 2010

(65) Prior Publication Data
US 2012/0281542 A1 Nov. 8, 2012

(30) Foreign Application Priority Data
Jun. 26, 2009 (CN) .......................... 2009 1 0142244

(51) Int. Cl.
*G01F 11/00* (2006.01)

(52) U.S. Cl.
USPC .......................................... 370/241; 370/311

(58) Field of Classification Search
None
See application file for complete search history.

(56) References Cited

U.S. PATENT DOCUMENTS

| | | |
|---|---|---|
| 7,054,288 B2 | 5/2006 | Sternberg |
| 7,639,644 B2 | 12/2009 | Sternberg |
| 2005/0180344 A1 | 8/2005 | Sternberg et al. |
| 2005/0276225 A1 * | 12/2005 | Mezer ........................... 370/241 |

(Continued)

FOREIGN PATENT DOCUMENTS

| | | |
|---|---|---|
| CN | 1859067 A | 11/2006 |
| CN | 1972170 A | 5/2007 |

OTHER PUBLICATIONS

International Search Report in international application No. PCT/CN2010/071737, mailed on Jul. 22, 2010.

(Continued)

*Primary Examiner* — David Oveissi (74) *Attorney, Agent, or Firm* — Oppedahl Patent Law Firm LLC (57) ABSTRACT

An information detection method and apparatus for a High Speed Downlink Shared Control Channel (HS-SCCH) are provided by the present disclosure, implementing the detection of HS-SCCH part1 with low false alarm probability and low false dismissal probability under the arbitrary combination of User Identifiers (UEID). The method is that: rate de-matching the front detection signal of each HS-SCCH part1 in the terminal HS-SCCH monitor set, obtaining the corresponding rate de-matched information; removing the user mask for the rate de-matched information of each HS-SCCH monitor channel; Viterbi decoding each rate de-matched information of which the user mask is removed, obtaining Viterbi-decoding 0 state accumulated metric of each HS-SCCH in HS-SCCH monitor set, and summing the absolute value of the soft information of each HS-SCCH monitor channel respectively, with the soft information being obtained by removing the user mask; according to the Viterbi 0 state accumulated metric of each HS-SCCH and the sum of absolute values of the corresponding soft information, obtaining determination variables of each HS-SCCH; selecting the maximum from the determination variables of HS-SCCH, comparing the maximum with the preset threshold, and determining whether the HS-SCCH of this user is detected.

17 Claims, 3 Drawing Sheets

(56) References Cited

U.S. PATENT DOCUMENTS

| | | |
|---|---|---|
| 2006/0126548 A1 | 6/2006 | Sternberg |
| 2006/0133259 A1* | 6/2006 | Lin et al. .................. 370/208 |
| 2006/0227734 A1* | 10/2006 | Tu et al. .................. 370/311 |
| 2007/0274222 A1* | 11/2007 | Kanno .................. 370/241 |

OTHER PUBLICATIONS

English Translation of the Written Opinion of the International Search Authority in international application No. PCT/CN2010/071737, mailed on Jul. 22, 2010.

\* cited by examiner

Fig. 4

INFORMATION DETECTION METHOD AND APPARATUS FOR HIGH SPEED DOWNLINK SHARED CONTROL CHANNEL

TECHNICAL FIELD

The disclosure relates to the field of a signal detection technology of communication technologies, and in particular to an information detection method and apparatus for a High Speed Downlink Shared Control Channel (HS-SCCH).

BACKGROUND

A High Speed Downlink Packet Access (HSDPA) technology is a high speed downlink packet access technology for Wideband Code Division Multiple Access (WCDMA) and the Time Division-Synchronization Code Division Multiple Access (TD-SCDMA); in order to improve the utilization rate of resources, the main physical resource of the HSDPA is the shared channel shared by different users; the downlink includes the High Speed-Downlink Shared Channel (HS-DSCH) and the High Speed-Downlink Shared Control Channel (HS-SCCH) which are used for providing a support for the high speed downlink data service of different users; HS-SCCH is the shared control channel of the HS-DSCH and is used for scheduling the usage of the HS-DSCH among different users. The WCDMA base station sends corresponding control information on a certain code channel of the HS-SCCH code channel set monitored by a user based on whether each user has a data to send during the next HS-DSCH Transmission Time Interval (TTI), and applies the mask modulo-2 and scrambling on control information by using a specific User Equipment Identifier (UEID); wherein the corresponding control information is divided into a first part control information (part1) and a second part control information (part2) which are transmitted sequentially; the access user of each HSDPA at the receiving end detects all the code channels of the corresponding HS-SCCH code channel set in each HS-SCCH TTI and determines whether its own HS-SCCH part1 information appears according to the UEID of this user; if the part1 information of this user is detected, the corresponding decoding information is applied to starting the descrambling and despreading of the corresponding HS-DSCH channel immediately and simultaneously starting the decoding process of the corresponding HS-SCCH part2 to obtain the decoding information related to the corresponding HS-DSCH channel; then, after finishing collecting the HS-DSCH channel, the decoding process of the HS-DSCH channel is started according to the HS-SCCH decoding information; therefore, the accurate reception of the HS-SCCH is the precondition for receiving the HS-DSCH channel data information; the error reception or the loss of HS-SCCH information will seriously influence the reception of HS-DSCH channel. However, whether the reception of HS-SCCH is accurate or not depends on the detection of the part1 information thereof; the high false dismissal probability of HS-SCCH part1 detection will cause a great loss of HS-DSCH information; the high false alarm probability will cause a frequent start of HS-DSCH, thereby increasing power consumption; in addition, the high false alarm probability will cause a frequent false detection of the HS-SCCH code channel of other users and then causes a loss of the HS-SCCH information of this user, which also causes a great loss of HS-DSCH information.

The detection algorithm of HS-SCCH part1 is mainly performed by using the accumulated state metric information at the end of the part1 Viterbi decoding; for example, the detection is performed by using the ratio of the difference between the maximum accumulated state metric "max_metric" and the minimum accumulated state metric "min_metric" to the minimum accumulated state metric, that is:

(max_metric−min_metric)/min_metric>threshold1.

However, with respective to this method, the false alarm probability is high and the false dismissal probability is unsatisfactory; the blind detection in standard applies the following algorithm:

(max_metric−min_metric)/(zero_metric−min_metric) >threshold2, that is:

the ratio of the difference between the maximum accumulated state metric "max_metric" and the minimum accumulated state metric "min_metric" to the difference between the zero state accumulated metric "zero_metric" and the minimum accumulated state metric is compared with the threshold to determine whether there is the HS-SCCH information of this user. This detection algorithm is on the basis that the maximum metric of the mask scrambled code word is approximately equiprobably distributed in any Viterbi state at the end of the Viterbi decoding; the maximum metric is approximately equiprobably distributed in 256 states in the WCDMA convolution encoding; therefore, the probability that the maximum metric converges to 0 state is ½56 on the HS-SCCH of other users; then the false alarm probability approximately approaches ½56, wherein the threshold2 extremely approaches 1. This method has a better false alarm probability and a better average false alarm probability. However, when the sent user UEID and the UEID of this user satisfy a specific relationship, the false alarm probability is high; therefore, the detection solution of HS-SCCH part 1 need be further improved and enhanced.

SUMMARY

The present disclosure provides an information detection method and apparatus for is HS-SCCH, which is capable of implementing the detection of the HS-SCCH part1 with low false alarm probability and low false dismissal probability under the arbitrary combination of the users.

The embodiment of the disclosure provides an information detection method for HS-SCCH, the method comprises the following steps of:

rate de-matching the front detection signal of a first part control information of each HS-SCCH in an HS-SCCH monitor set, obtaining rate de-matched information corresponding to the front detection signal of each HS-SCCH monitor channel; removing the user mask for each rate de-matched information;

Viterbi decoding each piece of rate de-matched information of which the user mask is removed, obtaining Viterbi-decoding 0 state accumulated metric corresponding to the front detection signal of each HS-SCCH monitor channel, and summing the absolute value of the soft information of each HS-SCCH information respectively, with the soft information being obtained by removing the user mask;

according to the Viterbi 0 state accumulated metric corresponding to the front detection signal of each HS-SCCH and the sum of absolute values of the corresponding soft information, obtaining determination variables of each HS-SCCH; selecting the maximum from the obtained determination variables of HS-SCCH, comparing the maximum with the preset threshold, and determining whether the HS-SCCH of this user is detected.

The method may further comprise a step of:

before the step of rate de-matching the front detection signal of the first part control information of each HS-SCCH in the HS-SCCH monitor set, normalizing the front detection signal of the first part control information part1 of each HS-SCCH in the HS-SCCH monitor set.

The step of normalizing the front detection signal of the first part control information of each HS-SCCH in the HS-SCCH monitor set may comprise the steps of:

caching the front detection signal of the first part control information of each HS-SCCH in the HS-SCCH monitor set and compressing the bit width thereof, wherein the compressed bit width is consistent with the input bit width of the subsequent Viterbi decoding.

The step of rate de-matching the front detection signal of the first part control information of each HS-SCCH in the HS-SCCH monitor set may comprise a step of:

filling 0 in the corresponding position of the bit, which is removed by puncturing during the partial encoding process of the first part control information in the front detection signal of the first part control information of each HS-SCCH.

The step of removing the user mask for each piece of rate de-matched information may comprise the steps of:

encoding the UEID of this user by using the ½ code rate convolution code, mapping the encoded UEID onto positive 1 and negative 1 (+/−1), and then pointwisely multiplying it with the sequence of the obtained rate de-matched information of each HS-SCCH monitor channel.

The step of obtaining determination variables of each HS-SCCH, according to the Viterbi 0 state accumulated metric corresponding to the front detection signal of each HS-SCCH and the sum of absolute values of the corresponding soft information, may comprise the steps of:

dividing the Viterbi 0 state accumulated metric corresponding to the front detection signal of each HS-SCCH by the sum of absolute values of the corresponding soft information respectively and obtaining the determination variables of each HS-SCCH.

If it is determined that the HS-SCCH of this user is detected, the method further comprises the steps of:

outputting the decode_out (Dcode_out) information which is obtained by Viterbi decoding and corresponds to the maximum in the determination variables of HS-SCCH, and outputting the starting code channel, the code channel number and the modulation information which are obtained according to the Dcode_out information.

The step of obtaining the code channel information and the modulation mode information according to the Dcode_out information may comprise the steps of:

shunting each HS-SCCH Dcode_out information to obtain the corresponding code channel information and modulation information, and calculating the corresponding starting code channel and code channel number according to each code channel information.

The steps of comparing the maximum with the preset threshold, and determining whether the HS-SCCH of this user is detected may comprise the steps of:

comparing the maximum with the preset threshold, if the maximum is greater than the threshold, determining that the HS-SCCH of this user is detected and using the HS-SCCH corresponding to the selected maximum determination variable as the HS-SCCH of this user; otherwise, determining that the HS-SCCH of this user is not detected.

An information detection apparatus for HS-SCCH, comprising:

a rate de-matching unit used for rate de-matching the front detection signal of the first part control information of each HS-SCCH in the HS-SCCH monitor set, obtaining the rate de-matched information of each HS-SCCH monitor channel and outputting the rate de-matched information to a user mask removing unit;

the user mask removing unit used for removing the user mask for each rate de-matched information and outputting the processed information to a decoder and a calculation unit;

a decoder used for Viterbi decoding each rate de-matched information of which the user mask is removed, obtaining the Viterbi-decoding 0 state accumulated metric corresponding to the front detection signal of each HS-SCCH monitor channel and outputting the Viterbi-decoding 0 state accumulated metric to a determination variable acquisition unit;

a calculation unit used for summing an absolute value of the soft information of each HS-SCCH information respectively, with the soft information being obtained by removing is the user mask, and then outputting the sum to the determination variable acquisition unit;

the determination variable acquisition unit used for obtaining determination variables of each HS-SCCH, according to the Viterbi 0 state accumulated metric corresponding to the front detection signal of each HS-SCCH and the sum of absolute values of the corresponding soft information, and outputting the determination variables to a detection unit;

the detection unit used for selecting the maximum from the obtained determination variables of HS-SCCH, comparing the maximum with the preset threshold, and determining whether the HS-SCCH of this user is detected.

The apparatus may further comprise:

a normalizing unit used for normalizing the front detection signal of each HS-SCCH and outputting the normalized signal to the rate de-matching unit before the rate de-matching unit rate de-matches the front detection signal of the first part control information of each HS-SCCH in the HS-SCCH monitor set.

The normalizing unit is specifically used for caching the front detection signal of the first part control information of each HS-SCCH in the HS-SCCH monitor set and compressing the bit width thereof, wherein the compressed bit width is consistent with the input bit width of the subsequent Viterbi decoding.

The rate de-matching unit is used for filling 0 in the corresponding position of the bit, which is removed by puncturing during the encoding process of the first part control information in each front detection signal.

The user mask removing unit is used for encoding the UEID of this user by using the ½ code rate convolution code and mapping the encoded UEID onto positive 1 and negative 1, and then pointwisely multiplying it with the sequence in each obtained rate de-matched information.

The determination variable acquisition unit is used for dividing the Viterbi 0 state accumulated metric corresponding to the front detection signal of each HS-SCCH by the sum of absolute values of the corresponding soft information respectively to obtain the determination variables of each HS-SCCH.

The apparatus may be further comprises:

a shunting unit used for shunting each HS-SCCH Dcode_out information from the decoder to obtain the corresponding code channel information and modulation information and outputting the code channel information and modulation information to a starting code channel and code channel number acquisition unit;

the starting code channel and code channel number acquisition unit used for calculating the corresponding starting code channel and code channel number according to each code channel information;

an output information selection unit used for outputting the Dcode out information which is obtained by Viterbi decoding and corresponds to the maximum, and outputting the starting code channel, the code channel number and the modulation information which are obtained according to the Dcode_out information.

The disclosure makes full use of the characteristics of HS-SCCH part1 code and user mask, and implements an accurate detection on whether the signal of this user exists on the HS-SCCH.

The embodiments of the disclosure can implement the detection of the WCDMA HS-SCCH part1 with low false alarm probability and low false dismissal probability under the arbitrary combination of User Identifiers (UEID); and can reduce the throughput loss caused by false alarm and false dismissal while the false alarm probability and the false dismissal probability both are low.

DETAILED DESCRIPTION

The embodiment of the disclosure detects whether there is a HS-SCCH of this user by using the characteristics of the HS-SCCH part1 user mask and the characteristics of Viterbi decoder, for implementing the detection with low false alarm probability and low false dismissal probability under the arbitrary combination of user identifiers (UEID).

The embodiment specifically comprises the following steps of: rate de-matching the front detection signal of the first part control information of each HS-SCCH in the HS-SCCH monitor set, obtaining the rate de-matched information corresponding to each front detection signal; removing the user mask for each rate de-matched information; Viterbi decoding each rate de-matched information of which the user mask is removed, obtaining Viterbi-decoding 0 state accumulated metric of the HS-SCCH corresponding to the front detection signal of each HS-SCCH monitor channel, and summing the absolute value of the soft information of each HS-SCCH information respectively, with the absolute value of the soft information being obtained by removing the user mask; according to the Viterbi 0 state accumulated metric of each HS-SCCH and the sum of absolute values of the corresponding soft information, obtaining determination variables of each HS-SCCH; selecting the maximum from the obtained determination variables of HS-SCCH, comparing the maximum with the preset threshold, and determining whether the HS-SCCH of this user is detected.

Figure 1:
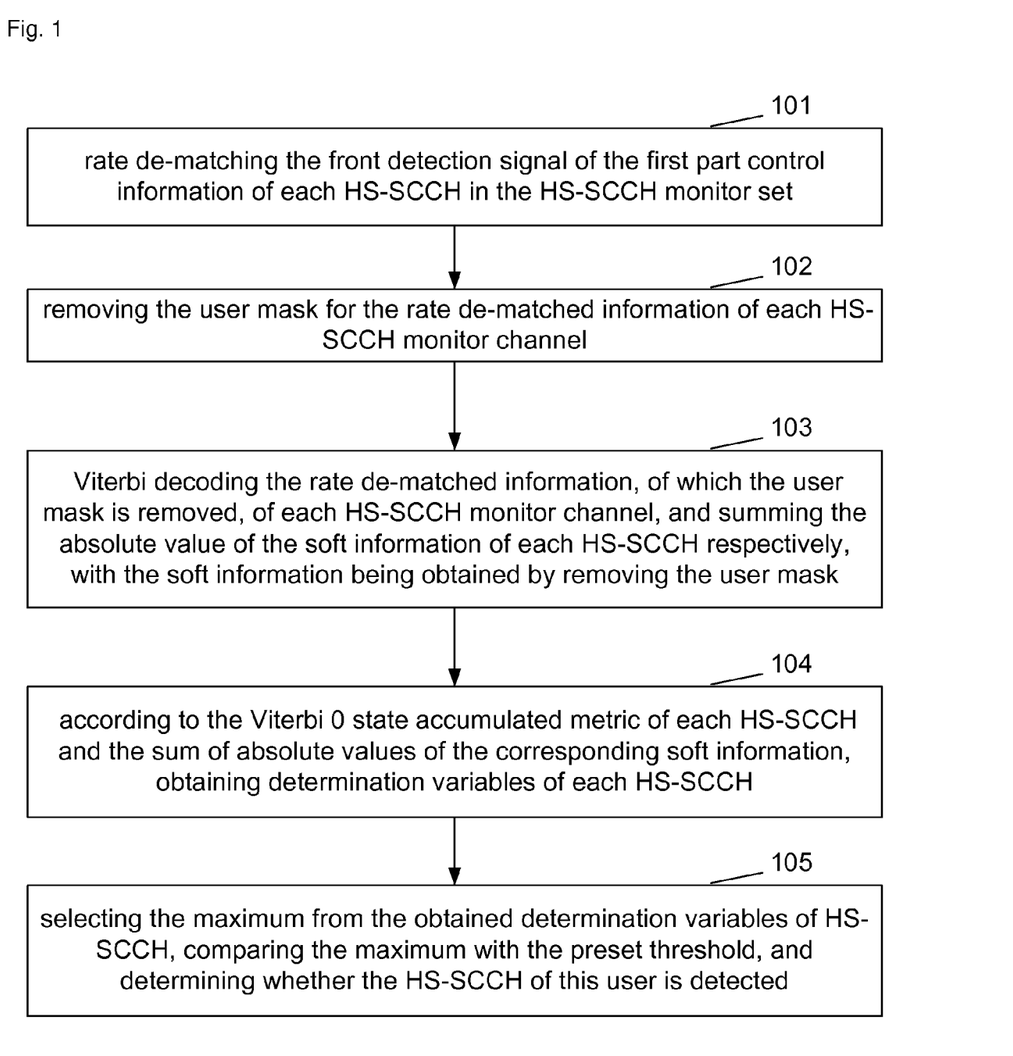
FIG. 1 is a flow chart of a method according to an embodiment of the disclosure.

As shown in FIG. 1, the specific implementation of the embodiment of the disclosure comprises the following steps of:

Step 101: rate de-matching the front detection signal of the first part control information of each HS-SCCH in the HS-SCCH monitor set, obtaining the rate de-matched information corresponding to the front detection signal of each HS-SCCH monitor channel;

in which, the rate de-matching can be configured as follows: filling 0 in the corresponding position of the bit, which is removed by puncturing during the partial encoding process of the first part control information in the front detection signal of each HS-SCCH monitor channel.

Before Step 101, the implementation further comprises a step of: normalizing each front detection signal, for example, caching each front detection signal and compressing the bit width thereof, wherein the compressed bit width is consistent with the input bit width of the subsequent Viterbi decoding for the convenience of the subsequent decoding.

Step 102: removing the user mask for the rate de-matched information of each HS-SCCH monitor channel;

for example, encoding the UEID of this user by using the WCDMA standard ½ code rate convolution code, and mapping the encoded UEID onto positive 1 and negative 1, that is, mapping 0 onto 1; mapping 1 onto −1; and then multiplying it with the sequence in each obtained rate de-matched information.

Step 103: Viterbi decoding each rate de-matched information of which the user mask is removed, obtaining the Viterbi-decoding 0 state accumulated metric corresponding to the front detection signal of each HS-SCCH channel, and summing the absolute value of the soft information of each HS-SCCH information respectively, with the absolute value of the soft information being obtained by removing the user mask.

Step 104: obtaining determination variables of each HS-SCCH, according to the Viterbi 0 state accumulated metric of each HS-SCCH and the sum of absolute values of the corresponding soft information;

for example, dividing the Viterbi 0 state accumulated metric of each HS-SCCH by the sum of absolute values of the corresponding soft information respectively and obtaining the determination variables of each HS-SCCH.

Step 105: selecting the maximum from the obtained determination variables of HS-SCCH, comparing the maximum with the preset threshold, and determining whether the HS-SCCH of this user is detected;

is Step 105 can be implemented by: comparing the maximum with the preset threshold, if the maximum is greater than the threshold, determining that the HS-SCCH of this user is detected and using the HS-SCCH corresponding to the selected maximum determination variable as the HS-SCCH of this user; otherwise, determining that the HS-SCCH of this user is not detected;

further, if it is determined that the HS-SCCH of this user is detected, outputting the Dcode out information which is obtained by Viterbi decoding, and outputting the starting code channel, the code channel number and the modulation information which are obtained according to the Dcode_out information.

The step of obtaining the code channel information and the modulation information according to the Dcode_out information specifically comprises the following steps of:

shunting each HS-SCCH Dcode_out information to obtain the corresponding code channel information and modulation information, and calculating the corresponding starting code channel and code channel number according to each code channel information.

Figure 2:
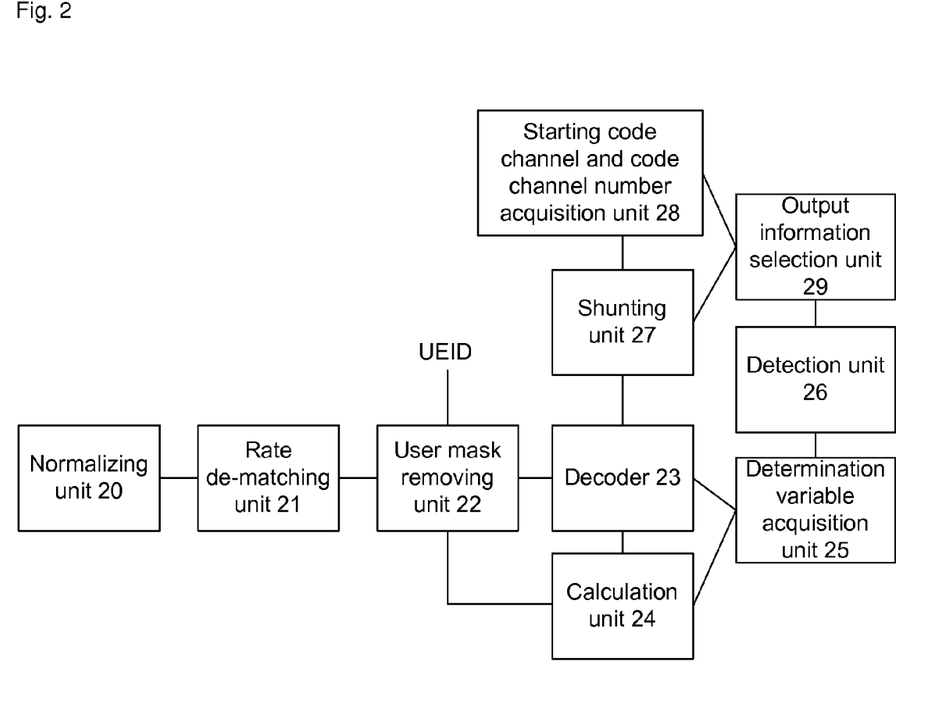
FIG. 2 is a structural diagram of an apparatus according to an embodiment of the disclosure.

As shown in FIG. 2, an information detection apparatus for HS-SCCH according to the embodiment of the disclosure mainly comprises: a rate de-matching unit 21, a user mask removing unit 22, a decoder 23, a calculation unit 24, a determination variable acquisition unit 25 and a detection unit 26, wherein, the rate de-matching unit 21 is used for rate de-matching the front detection signal of the first part control information of each HS-SCCH in the HS-SCCH monitor set, obtaining the rate de-matched information corresponding to each front detection signal and outputting the rate de-matched information to the user mask removing unit 22;

the user mask removing unit 22 is used for removing the user mask for each rate de-matched information and outputting the processed information to the decoder 23 and the calculation unit 24;

the decoder 23 is used for Viterbi decoding each rate de-matched information of which the user mask is removed, obtaining the Viterbi-decoding 0 state accumulated metric of the HS-SCCH corresponding to each front detection signal, and outputting the Viterbi-decoding 0 state accumulated metric to the determination variable acquisition unit 25;

the calculation unit 24 is used for summing the absolute value of the soft information of each HS-SCCH information respectively, with the absolute value of the soft information being obtained by removing the user mask, and then outputting the sum to the determination variable acquisition unit 25;

the determination variable acquisition unit 25 is used for obtaining determination variables of each HS-SCCH, according to the Viterbi 0 state accumulated metric of each HS-SCCH and the sum of absolute values of the corresponding soft information, and outputting the determination variables to the detection unit 26;

the detection unit 26 is used for selecting the maximum from the obtained determination variables of HS-SCCH, comparing the maximum with the preset threshold, and determining whether the HS-SCCH of this user is detected.

The apparatus further comprises:

a normalizing unit 20 used, before the rate de-matching unit 21 rate de-matches the front detection signal of the first part control information of the detected HS-SCCH, for normalizing each front detection signal and outputting the normalized signal to the rate de-matching unit.

The normalizing unit 20 is specifically used for caching each front detection signal and compressing the bit width thereof, wherein the compressed bit width is consistent with the input bit width of the subsequent Viterbi decoding; at this moment, the rate de-matching unit 21 is used for filling 0 in the corresponding position of the bit, which is removed by puncturing during the partial encoding process of the first part control information in each front detection signal.

The user mask removing unit 22 is used for encoding the UEID of this user by using the ½ code rate convolution code and mapping the encoded UEID onto positive 1 and negative 1, and then pointwisely multiplying it with the sequence in each obtained rate de-matched information.

The determination variable acquisition unit 25 is used for dividing the Viterbi 0 state accumulated metric of each HS-SCCH by the sum of absolute values of the corresponding soft information respectively to obtain the determination variables of each HS-SCCH.

The apparatus further comprises:

a shunting unit 27 used for shunting each HS-SCCH Dcode_out information from the decoder 23 to obtain the corresponding code channel information and modulation information and outputting the code channel information and modulation information to a starting code channel and code channel number acquisition unit 28;

the starting code channel and code channel number acquisition unit 28 used for calculating the corresponding starting code channel and code channel number according to each code channel information;

an output information selection unit 29 used for outputting the Dcode_out information which is obtained by Viterbi decoding, and outputting the starting code channel, the code channel number and the modulation information which are obtained according to the Dcode_out information.

For a better understanding of the technical solution and advantages of the present disclosure, three HS-SCCHs are taken as examples to further illustrate the technical solution of the disclosure in detail in combination with accompanying drawings.

Figure 3:
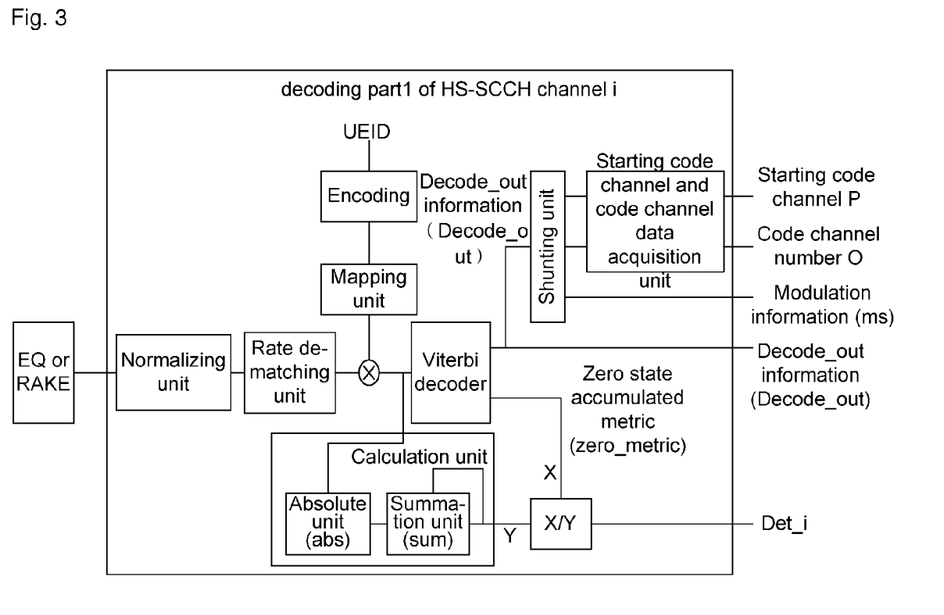
FIG. 3 is a structural diagram of a specific embodiment of the apparatus shown in FIG. 2 excluding the detection unit part.
Figure 4:
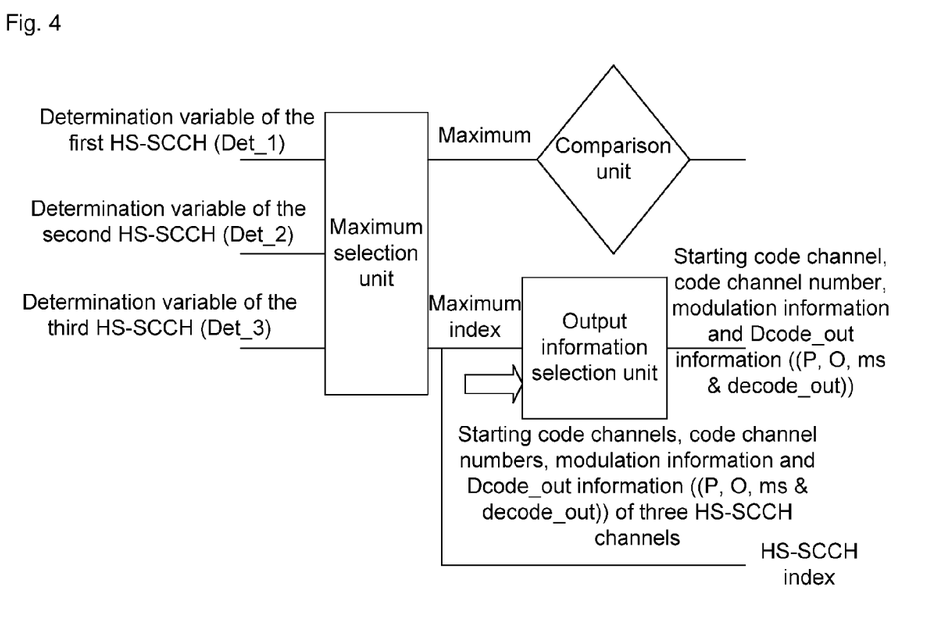
FIG. 4 is a structural diagram of a specific embodiment of the detection unit included in the apparatus shown in FIG. 2.

As shown in FIG. 3 and FIG. 4, an accurate detection on whether the HS-SCCH has the signal of this user is performed by using the characteristics of the HS-SCCH part1 code and user mask in WCDMA HS-SCCH in the embodiment of the disclosure; the specific working principle is as follows:

an equalizer (EQ) or a Rake receiver outputs the front detection signals of the part1 of three HS-SCCH monitor code channels, wherein each HS-SCCH is of 40 bits;

the normalizing unit caches the received front detection signal and respectively compresses the bit widths of the three HS-SCCHs to be consistent with the input bit width of the Viterbi decoder, for the convenience of the decoder to decode;

the rate de-matching unit rate de-matches the 40-bit information of each HS-SCCH to be 48 bits, i.e., filling 0 in the first, second, fourth, eighth, $42^{nd}$, $45^{th}$, $47^{th}$ and $48^{th}$ positions and filling the 40 bits of the received information in the rest positions sequentially; and outputs the rate de-matched information of the three HS-SCCHs;

the encoding unit encodes the 16-bit UEID of this user by using the ½ code rate convolution code regulated in WCDMA; the mapping unit maps the encoded UEID onto positive 1 and negative 1 to output by using the 1-2*code (the code is a code word obtained by encoding) mode; the multiplication unit multiplies the signal output from the mapping unit with the rate de-matched information of the three HS-SCCHs output from the rate de-matching unit and then outputs the result;

the three rate de-matched information output from the multiplication unit are respectively sent to the Viterbi decoder to decode, so as to obtain the respective Viterbi 0 state accumulated metric and the Dcode_out information of the three HS-SCCHs;

the shunting unit respectively shunts the Dcode_out information of the three HS-SCCHs to obtain code channel information (ccs) and modulation information (ms); the starting code channel and code channel number acquisition unit calculates the respective starting code channel P and code channel number O according to ccs respectively;

the calculation unit comprises a absolute unit (abs) and a summation unit (sum), wherein the abs is used for calculating the absolute values of the three HS-SCCH information sequences output from the multiplication unit sequentially; the sum is used for summing the absolute values of each HS-SCCH information sequence respectively;

the Viterbi 0 state accumulated metric of each HS-SCCH output from the Viterbi decoder is divided by the respective absolute-value sum obtained from the calculation unit to obtain the determination variable of each HS-SCCH;

the maximum selection unit is used to select the maximum from the obtained determination variables (that is, Det_1, Det_2 and Det_3) of the three HS-SCCHs and output the HS-SCCH index of the maximum and the selected maximum of the determination variables; the comparison unit compares the received maximum of the determination variables with a preset threshold; if the maximum is greater than the threshold, it is determined that the HS-SCCH of this user is detected; the output information selection unit, according to the received HS-SCCH index of the maximum, selects the P, O, ms and Dcode_out information of the corresponding HS-SCCH as the required information and outputs the information for subsequent processing; otherwise, it is determined that the HS-SCCH of this user is not detected.

It needs to be noted that, if the noise can not cause the soft bit information sign bits to invert due to a high signal-to-noise ratio, under the condition of applying 0-bit to resetting the final state to 0 in the encoding process and the condition of no mask, the 0 state accumulated metric of Viterbi decoder is the sum of absolute values of the code word bit soft information (ck); at this time, a random inversion of the sign bits of k bits (k is less than ½ of minimum code distance) will cause an average reduction of 2 k*mean(abs(ck)) for the 0 state accumulated metric.

HS-SCCH part1 information is encoded by using ⅓ code rate of puncturing in WDCMA, the minimum hamming distance is 13; the mask is encoded by using ½ code rate of puncturing, the minimum hamming distance between the code word thereof and the code word encoded by ⅓ code rate of puncturing is 5 (not all zero code); therefore, if the transmitted code word is not the information of this user, the Viterbi Dcode_out result obtained by using the user mask will cause an average reduction of 10*mean(abs(ck)) for the 0 state accumulated metric.

The embodiment of the disclosure applies the following detection method:

$$\text{zero\_metric}/\text{sum}(\text{abs}(ck)) > \text{threshold}.$$

in which, zero_metric is the 0 state accumulated metric of Viterbi decoder, sum(abs(ck)) is the sum of absolute values of the Viterbi input soft information; the threshold should be selected properly; if the threshold is too high, the false dismissal probability will be increased and the false alarm probability will be reduced; otherwise, the false dismissal probability will be reduced and the false alarm probability will be increased; theoretically, the threshold value should be 30/40 approximately in case of high signal-to-noise ratio; however, since the noise will cause an inversion of signal polarity in case of low signal-to-noise ratio, the threshold value should be up regulated; the specific value should be compromised between the false dismissal probability and the false alarm probability by emulation or other methods.

In view of the problem of high false alarm probability for the present WCDMA HS-SCCH part1 detection under the combination of specific user UEIDs, the HS-SCCH part1 detection method provided by the embodiment of the disclosure detects whether there is the HS-SCCH of this user by using the characteristics of user mask and the characteristics of Viterbi decoder, and solves the problem of a frequent false start of HS-DSCH and high power consumption, and the problem of HS-DSCH loss and throughput loss which are caused by the HS-SCCH loss of this user due to a false detection of the HS-SCCH of other users. Since the false alarm probability and the false dismissal probability are sensitive to the selection of threshold, the threshold can be configured between the false alarm probability and the false dismissal probability to compromise; therefore, the threshold is flexible to select; under the arbitrary combination of UEIDs, the threshold can be selected properly to guarantee a low false alarm probability and a low false dismissal probability. The disclosure is simple to implement and can be implemented under lower hardware complexity.

Obviously, those skilled in the art can make various changes and modifications to the disclosure without departing from the spirit and scope of the disclosure. If these changes and modifications belong to the claims of the disclosure and the scope of the equivalent techniques, the disclosure is intended to include these changes and modifications.

What is claimed is:

1. An information detection method for a High Speed Downlink Shared Control Channel (HS-SCCH), comprising:

rate de-matching a front detection signal of a first part control information of each HS-SCCH in a HS-SCCH monitor set, obtaining a piece of rate de-matched information corresponding to the front detection signal of each HS-SCCH monitor channel; removing a user mask for each rate de-matched information;

Viterbi decoding each rate de-matched information of which the user mask is removed, obtaining Viterbi-decoding 0 state accumulated metric corresponding to the front detection signal of each HS-SCCH monitor channel, and summing an absolute value of soft information of each HS-SCCH information respectively, with the absolute value of the soft information being obtained by removing the user mask; and obtaining determination variables of each HS-SCCH, according to the Viterbi 0 state accumulated metric corresponding to the front detection signal of each HS-SCCH and the sum of absolute values of the corresponding soft information; selecting a maximum from the obtained determination variables of HS-SCCH, comparing the maximum with the preset threshold, and determining whether the HS-SCCH of this user is detected.

2. The information detection method according to claim 1, the method further comprising:

normalizing the front detection signal of the first part control information of each HS-SCCH in the HS-SCCH monitor set before the step of rate de-matching the front detection signal of the first part control information of each HS-SCCH in the HS-SCCH monitor set.

3. The information detection method according to claim 2, wherein the step of normalizing the front detection signal of the first part control information of each HS-SCCH in the HS-SCCH monitor set comprises the steps of:

caching the front detection signal of the first part control information of each HS-SCCH in the HS-SCCH monitor set and compressing the bit width thereof, wherein the compressed bit width is consistent with the input bit width of the subsequent Viterbi decoding.

4. The information detection method according to claim 1, wherein the step of rate de-matching the front detection signal of the first part control information of each HS-SCCH in the HS-SCCH monitor set comprises a step of:

filling 0 in the corresponding position of the bit, which is removed by puncturing during the partial encoding process of the first part control information in the front detection signal of the first part control information of each HS-SCCH.

5. The information detection method according to claim 1, wherein the step of removing the user mask for each rate de-matched information comprises the steps of:

encoding the UEID of this user by using the ½code rate convolution code, mapping the encoded UEID onto positive 1 and negative 1, and then pointwisely multiplying it with the sequence of the obtained rate de-matched information of each HS-SCCH monitor channel.

6. The information detection method according to claim 1, wherein the step of obtaining determination variables of each HS-SCCH, according to the Viterbi 0 state accumulated metric corresponding to the front detection signal of each HS-SCCH and the sum of absolute values of the corresponding soft information, comprises the steps of:

dividing the Viterbi 0 state accumulated metric corresponding to the front detection signal of each HS-SCCH by the sum of absolute values of the corresponding soft information respectively and obtaining the determination variables of each HS-SCCH.

7. The information detection method according to claim 1, wherein if it is determined that the HS-SCCH of this user is detected, the method further comprises the steps of:
outputting the decode_out information which is obtained by Viterbi decoding and corresponds to the maximum in the determination variables of HS-SCCH, and outputting the starting code channel, the code channel number and the modulation information which are obtained according to the decode_out information.

8. The information detection method according to claim 7, wherein the step of obtaining the code channel information and the modulation mode information according to the decode_out information comprises the steps of:
shunting each HS-SCCH decode_out information to obtain the corresponding code channel information and modulation information, and calculating the corresponding starting code channel and code channel number according to each code channel information.

9. The information detection method according to claim 1, wherein the steps of comparing the maximum with the preset threshold and determining whether the HS-SCCH of this user is detected comprise the steps of:
comparing the maximum with the preset threshold, if the maximum is greater than the threshold, determining that the HS-SCCH of this user is detected and using the HS-SCCH corresponding to the selected maximum determination variable as the HS-SCCH of this user; otherwise, determining that the HS-SCCH of this user is not detected.

10. An information detection apparatus for a High Speed Downlink Shared Control Channel (HS-SCCH), comprising:
a rate de-matching unit used for rate de-matching the front detection signal of a first part control information of each HS-SCCH in an HS-SCCH monitor set, obtaining a piece of rate de-matched information of each HS-SCCH monitor channel and outputting the rate de-matched information to a user mask removing unit;
the user mask removing unit used for removing a user mask for each rate de-matched information and outputting the processed information to a decoder and a calculation unit;
the decoder used for Viterbi decoding each rate de-matched information of which the user mask is removed, obtaining Viterbi-decoding 0 state accumulated metric corresponding to the front detection signal of each HS-SCCH monitor channel and outputting the Viterbi-decoding 0 state accumulated metric to a determination variable acquisition unit;
the calculation unit used for summing an absolute value of the soft information of each HS-SCCH information respectively, with the absolute value of the soft information being obtained by removing the user mask, and then outputting the sum to the determination variable acquisition unit;
the determination variable acquisition unit used for obtaining determination variables of each HS-SCCH, according to the Viterbi 0 state accumulated metric corresponding to the front detection signal of each HS-SCCH and the sum of absolute values of the corresponding soft information, and outputting the determination variables to a detection unit;
the detection unit used for selecting a maximum from the obtained determination variables of HS-SCCH, comparing the maximum with the preset threshold, and determining whether the HS-SCCH of this user is detected.

11. The information detection apparatus according to claim 10, further comprising:
a normalizing unit used for normalizing the front detection signal of each HS-SCCH and outputting the normalized signal to the rate de-matching unit before the rate de-matching unit rate de-matches the front detection signal of the first part control information of each HS-SCCH in the HS-SCCH monitor set.

12. The information detection apparatus according to claim 11, wherein the normalizing unit is specifically used for caching the front detection signal of the first part control information of each HS-SCCH in the HS-SCCH monitor set and compressing the bit width thereof, wherein the compressed bit width is consistent with the input bit width of the subsequent Viterbi decoding.

13. The information detection apparatus according to claim 12, wherein the rate de-matching unit is used for filling 0 in the corresponding position of the bit, which is removed by puncturing during the encoding process of the first part control information in each front detection signal.

14. The information detection apparatus according to claim 12, wherein the user mask removing unit is used for encoding the UEID of this user by using the ½code rate convolution code and mapping the encoded UEID onto positive 1 and negative 1, and then pointwisely multiplying it with the sequence in each obtained rate de-matched information.

15. The information detection apparatus according to claim 12, wherein the determination variable acquisition unit is used for dividing the Viterbi 0 state accumulated metric corresponding to the front detection signal of each HS-SCCH by the sum of absolute values of the corresponding soft information respectively to obtain the determination variables of each HS-SCCH.

16. The information detection apparatus according to claim 10, further comprising:
a shunting unit used for shunting each HS-SCCH decode_out information from the decoder to obtain the corresponding code channel information and modulation information and outputting the code channel information and modulation information to a starting code channel and code channel number acquisition unit;
the starting code channel and code channel number acquisition unit used for calculating the corresponding starting code channel and code channel number according to each code channel information;
an output information selection unit used for outputting the decode_out information which is obtained by Viterbi decoding and corresponds to the maximum, and outputting the starting code channel, the code channel number and the modulation information which are obtained according to the decode_out information.

17. The information detection apparatus according to claim 11, further comprising:
a shunting unit used for shunting each HS-SCCH decode_out information from the decoder to obtain the corresponding code channel information and modulation information and outputting the code channel information and modulation information to a starting code channel and code channel number acquisition unit;
the starting code channel and code channel number acquisition unit used for calculating the corresponding starting code channel and code channel number according to each code channel information;

an output information selection unit used for outputting the decode_out information which is obtained by Viterbi decoding and corresponds to the maximum, and outputting the starting code channel, the code channel number and the modulation information which are obtained according to the decode_out information.

* * * * *

UNITED STATES PATENT AND TRADEMARK OFFICE
CERTIFICATE OF CORRECTION

PATENT NO. : 8,526,312 B2  Page 1 of 1
APPLICATION NO. : 13/258393
DATED : September 3, 2013
INVENTOR(S) : Haiyong Xiao It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 117 days.

Signed and Sealed this
Fifteenth Day of September, 2015

Michelle K. Lee
*Director of the United States Patent and Trademark Office*